US012768542B2

(12) United States Patent
Jo et al.

(10) Patent No.: US 12,768,542 B2
(45) Date of Patent: Oct. 20, 2026

(54) COOKING APPLIANCE

(71) Applicant: SAMSUNG ELECTRONICS CO., LTD., Suwon-si (KR)

(72) Inventors: Jaehee Jo, Suwon-si (KR); Sangwon Yun, Suwon-si (KR); Myoungkeun Kwon, Suwon-si (KR); Sangjin Kim, Suwon-si (KR); Hyeokkyun Kim, Suwon-si (KR); Changhyun Son, Suwon-si (KR); Sungmin Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 406 days.

(21) Appl. No.: 18/239,596

(22) Filed: Aug. 29, 2023

(65) Prior Publication Data

US 2024/0133559 A1 Apr. 25, 2024
US 2024/0230103 A9 Jul. 11, 2024

Related U.S. Application Data

(63) Continuation of application No. PCT/KR2023/011593, filed on Aug. 7, 2023.

(30) Foreign Application Priority Data

Oct. 24, 2022 (KR) ........................ 10-2022-0137816
Nov. 18, 2022 (KR) ........................ 10-2022-0155768

(51) Int. Cl.
*F24C 15/00* (2006.01)
*F21V 29/67* (2015.01)
(Continued)

(52) U.S. Cl.
CPC .......... *F24C 15/006* (2013.01); *F21V 29/677* (2015.01); *F24C 15/008* (2013.01); *G03B 17/55* (2013.01); *H05K 7/20145* (2013.01)

(58) Field of Classification Search
CPC .... F21V 29/677; F24C 15/006; F24C 15/008; G03B 17/55; H05K 7/20145
(Continued)

(56) References Cited

U.S. PATENT DOCUMENTS 6,127,666 A 10/2000 Sohn
7,856,973 B2 12/2010 Kim et al.
(Continued)

FOREIGN PATENT DOCUMENTS

CN 203454231 U 2/2014
EP 1041346 B1 9/2008
(Continued)

OTHER PUBLICATIONS

International Search Report dated Nov. 29, 2023 issued by the International Searching Authority in International Application No. PCT/KR2023/011593.

(Continued)

*Primary Examiner* — Vivek K Shirsat
(74) *Attorney, Agent, or Firm* — Sughrue Mion, PLLC

(57) ABSTRACT

Provided is a cooking appliance including: a main body including a cooking chamber, a door positioned at a front of the main body to open and close the cooking chamber, a camera disposed toward the cooking chamber to obtain a photograph an inside of the cooking chamber, a camera cooling fan configured to intake external air to cool the camera, and an air guide configured to form a flow path such that external air is provided toward the camera by the camera cooling fan. The air guide guides air passed through the camera to be discharged toward a front of the camera cooling fan.

16 Claims, 10 Drawing Sheets

(51) Int. Cl.
*G03B 17/55* (2021.01)
*H05K 7/20* (2006.01)

(58) Field of Classification Search
USPC .................................................... 126/19 R
See application file for complete search history.

(56) References Cited

U.S. PATENT DOCUMENTS

| | | | |
|---|---|---|---|
| 9,551,493 | B2 | 1/2017 | Lee et al. |
| 10,524,317 | B2 | 12/2019 | Kondo et al. |
| 11,116,050 | B1 | 9/2021 | Bhogal et al. |
| 2018/0058702 | A1* | 3/2018 | Jang ...................... F24C 15/322 |
| 2021/0144286 | A1* | 5/2021 | Jang ....................... G03B 17/55 |
| 2023/0160577 | A1 | 5/2023 | Lee et al. |

FOREIGN PATENT DOCUMENTS

| | | | |
|---|---|---|---|
| JP | 5812676 | B2 | 11/2015 |
| JP | 2016-80210 | A | 5/2016 |
| KR | 2000-0003794 | U | 2/2000 |
| KR | 2000-0003796 | U | 2/2000 |
| KR | 2000-0003800 | U | 2/2000 |
| KR | 10-0275886 | B1 | 2/2001 |
| KR | 10-0698204 | B1 | 3/2007 |
| KR | 10-0767847 | B1 | 10/2007 |
| KR | 10-1004518 | B1 | 12/2010 |
| KR | 10-2011-0085009 | A | 7/2011 |
| KR | 10-2018-0025787 | A | 3/2018 |
| KR | 10-1931366 | B1 | 12/2018 |
| KR | 10-2021-0016771 | A | 2/2021 |
| KR | 10-2022-0014508 | A | 2/2022 |
| KR | 10-2022-0136027 | A | 10/2022 |

OTHER PUBLICATIONS

Written Opinion dated Nov. 29, 2023 issued by the International Searching Authority in International Application No. PCT/KR2023/011593.

* cited by examiner

COOKING APPLIANCE

CROSS-REFERENCE TO RELATED APPLICATION(S)

This application is a bypass continuation of International Application No. PCT/KR2023/011593, filed on Aug. 7, 2023, which is based on and claims priority to Korean Patent Application Nos. 10-2022-0137816, filed on Oct. 24, 2022 and 10-2022-0155768 filed on Nov. 18, 2022 in the Korean Intellectual Property Office, the disclosures of which are incorporated herein by reference.

BACKGROUND

1. Field

The disclosure relates to a cooking appliance, and more specifically, to a cooking appliance having a camera.

2. Description of the Related Art

An oven is an appliance equipped with a cooking chamber, a heating device for applying heat to the cooking chamber, and a circulation fan for circulating heat generated by the heating device in the cooking chamber for cooking food.

The oven, as an appliance for cooking by heating food in a sealed state, may be classified as one of an electric type oven, a gas type oven, and an electronic type oven according to a heating source thereof. An electric oven may use an electric heater as a heating source, a gas oven may use heat generated by gas as a heating source, and a microwave oven may use frictional heat of water molecules due to high frequency as a heating source.

An oven has a main body with a front that is open to form a cooking chamber, into which food to be cooked is input, while forming the external appearance, a door installed on the front of the main body to selectively open and close the cooking chamber, and a control panel installed on the front of the main body to allow a user to set a desired cooking mode or to set various conditions required for cooking.

During the cooking process, there may be a need to check the state of food in the cooking chamber. To this end, a camera for photographing the inside of the cooking chamber may be installed in the oven.

The camera may be disposed adjacent to the cooking chamber to photograph the inside of the cooking chamber. Because the inside of the cooking chamber is maintained at a high temperature during the cooking process, the temperature of the camera may be caused to rise, which may damage the camera. Therefore, a camera cooling fan may be installed in the oven to prevent damage to the camera. The camera cooling fan may cool the camera by intaking external air.

SUMMARY

Provided is a cooking appliance capable of easily photographing the inside of a cooking chamber, efficiently cooling electric components, and facilitating arrangement of electric components.

The technical objectives of the disclosure are not limited to the above, and other objectives may become apparent to those of ordinary skill in the art based on the following description.

According to an aspect of the disclosure, there is provided a cooking appliance including: a main body including a cooking chamber; a door positioned at a front of the main body configured to open and close the cooking chamber; a camera disposed toward the cooking chamber configured to obtain a photograph of an inside of the cooking chamber; a camera cooling fan configured to intake external air to cool the camera; and an air guide configured to form a flow path such that external air is provided toward the camera by the camera cooling fan, the air guide configured to guide air passed through the camera to be discharged toward a front of the camera cooling fan.

The air guide may include: a suction duct in which the camera is provided, the suction duct being configured to form a suction flow path of air; and an exhaust duct connected to the suction duct, the camera cooling fan may be provided in the exhaust duct, and the exhaust duct may be configured to form an exhaust flow path of air.

The exhaust duct may include a front outlet that is open toward the front of the camera cooling fan.

The suction duct may include an upper housing and a lower housing provided on a lower side of the upper housing, and the upper housing may be adjacent to the front outlet and may be configured to guide the air discharged from the front outlet.

The upper housing may include a guide surface obliquely facing upward in a direction forward from the front outlet.

The cooking appliance may further include a control panel formed on the front of the main body and on which a printed circuit board (PCB) is mounted, wherein the front outlet may be open toward the control panel.

The air guide may further include guide sidewalls configured to guide the air discharged from the front outlet toward the PCB.

The cooking appliance may further include a lamp disposed toward the cooking chamber and configured to provide light into the cooking chamber, wherein the exhaust duct may further include lamp outlets that are open toward the lamp.

The front outlet may be larger than the lamp outlets.

The air guide may further include a lamp guide duct configured to guide the air discharged from the lamp outlets toward the lamp.

The lamp guide duct may further include lamp guide duct inlets connected to the lamp outlets and lamp guide duct outlets through which air drawn to the lamp guide duct inlets is discharged.

A main cooling fan may be arranged at a rear of the air guide, wherein the lamp guide duct outlets may be open toward the main cooling fan.

The lamp may include a first lamp and a second lamp spaced apart from the first lamp, wherein the lamp outlets may include a first lamp outlet opening toward the first lamp, and a second lamp outlet opening toward the second lamp.

The first lamp outlet and the second lamp outlet are open in opposite directions.

The front outlet may be provided between the first lamp outlet and the second lamp outlet.

According to an aspect of the disclosure, there is provided a cooking device including a cooking chamber; a door configured to open and close the cooking chamber; a camera disposed toward the cooking chamber configured to obtain a photograph of the cooking chamber; a camera cooling fan configured to cool the camera; and an air guide configured to provide external air toward the camera, the air guide configured to guide air passed through the camera to be discharged toward a front of the camera cooling fan.

The air guide may include: a suction duct in which the camera is provided, the suction duct being configured to form a suction flow path of air; and an exhaust duct connected to the suction duct, the camera cooling fan may be provided in the exhaust duct, and the exhaust duct may be configured to form an exhaust flow path of air.

The exhaust duct may include a front outlet that may be open toward the front of the camera cooling fan.

The suction duct includes an upper housing and a lower housing provided on a lower side of the upper housing, and the upper housing is adjacent to the front outlet and is configured to guide the air discharged from the front outlet.

The upper housing includes a guide surface obliquely facing upward in a direction forward from the front outlet.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
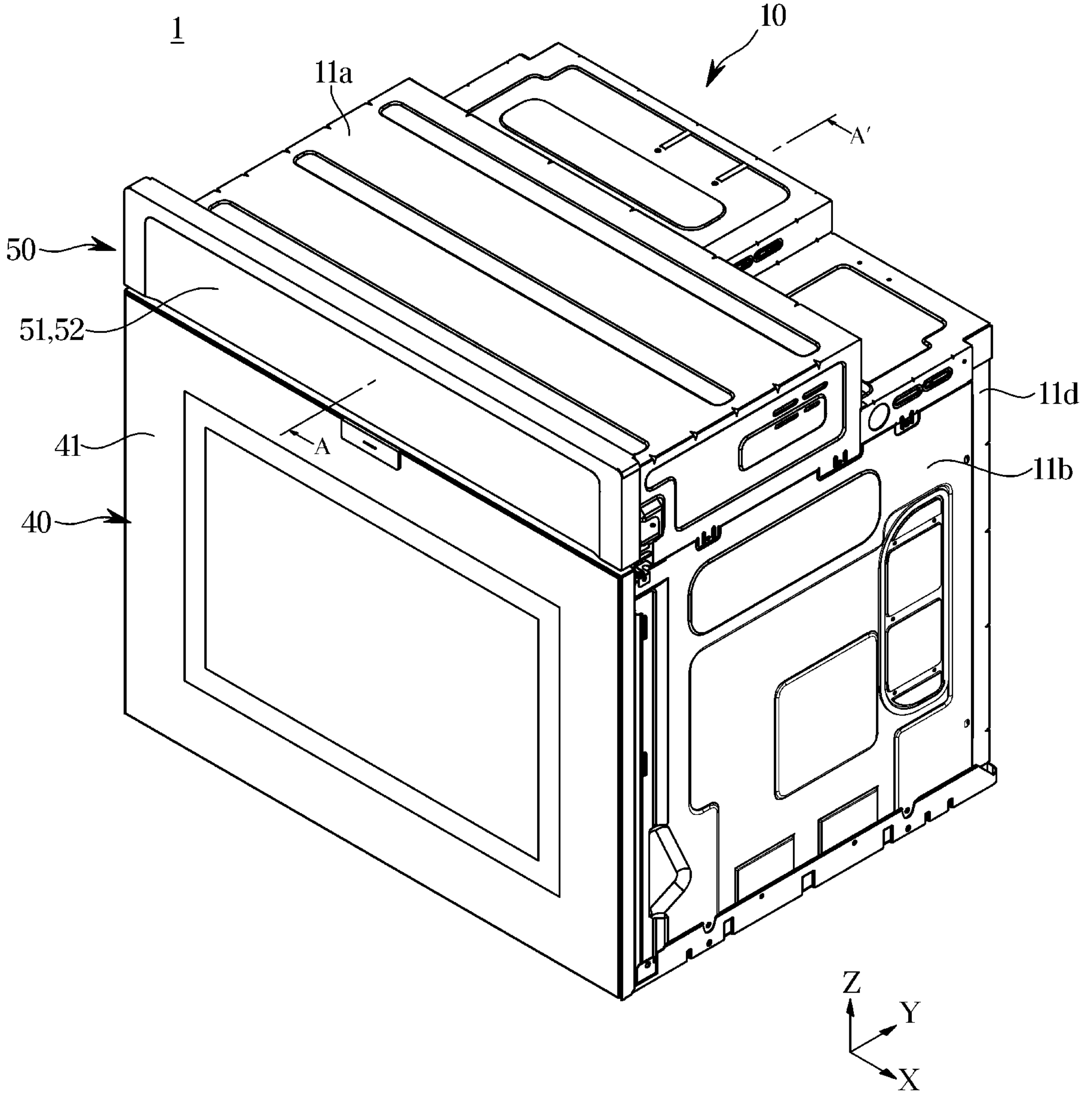
FIG. 1 is a perspective view illustrating a cooking appliance, according to an embodiment of the disclosure.

Embodiments described in the specification and configurations shown in the accompanying drawings are merely examples, and various modifications may be made to the embodiments and the drawings of the disclosure.

Further, identical symbols or numbers in the drawings of the disclosure denote components or elements configured to perform substantially identical functions.

Further, terms used herein are only for the purpose of describing particular embodiments and are not intended to limit to the disclosure. The singular form is intended to include the plural form as well, unless the context clearly indicates otherwise. It should be further understood that the terms “include,” “including,” “have,” and/or “having” specify the presence of stated features, integers, steps, operations, elements, components, and/or groups thereof, but do not preclude the presence or addition of one or more other features, integers, steps, operations, elements, components, and/or groups thereof.

Further, it should be understood that, although the terms “first,” “second,” etc. may be used herein to describe various elements, the elements are not limited by the terms, and the terms are only used to distinguish one element from another. For example, a first element could be termed a second element, and similarly, a second element could be termed a first element without departing from the scope of the disclosure. The term “and/or” includes combinations of one or all of a plurality of associated listed articles.

The terms “front”, “upper”, “lower”, “left”, and “right” as herein used are defined with respect to the drawings, but the terms may not restrict the shape and position of the respective components.

Hereinafter, embodiments according to the disclosure will be described in detail with reference to the accompanying drawings.

Figure 2:
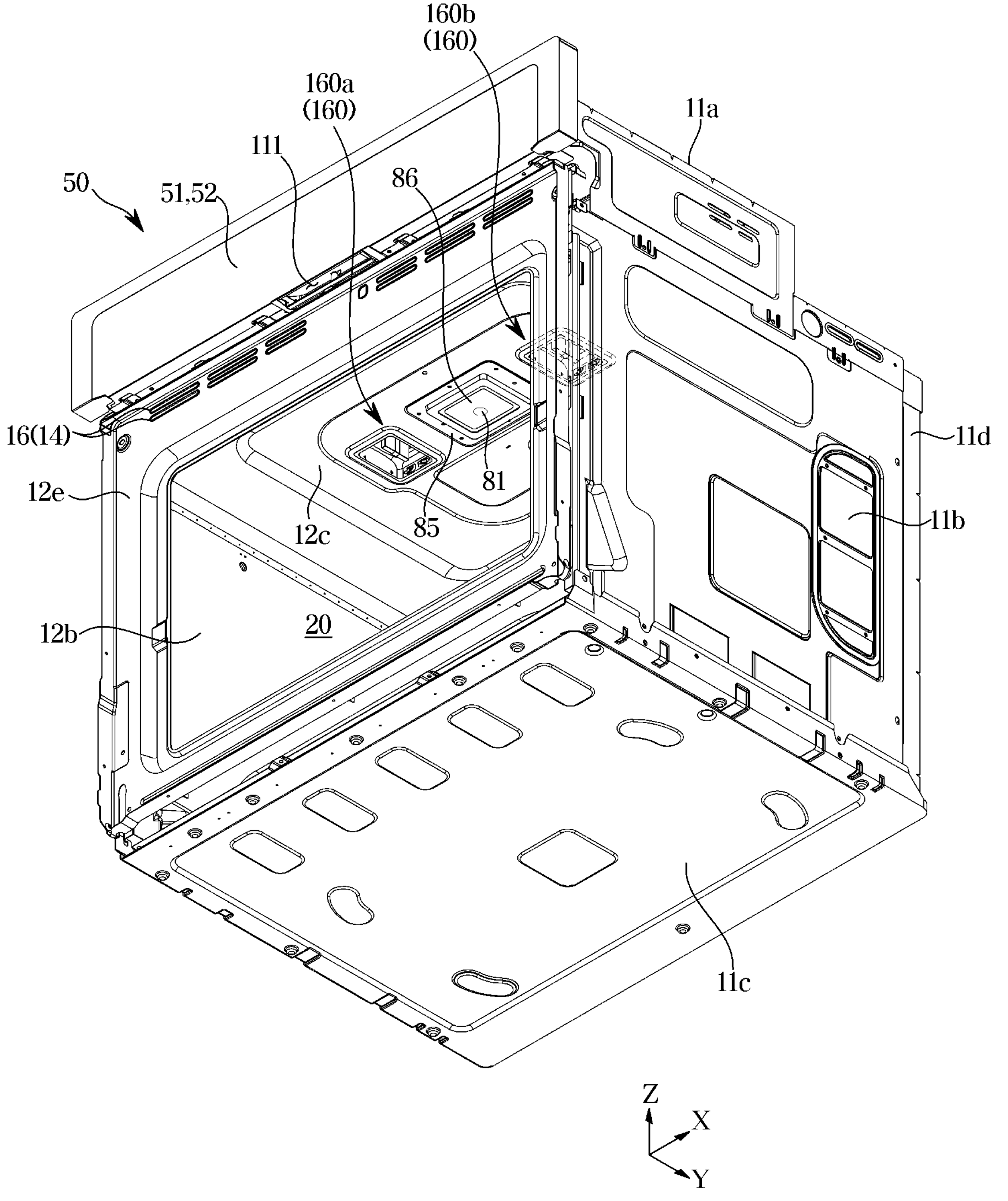
FIG. 2 is a perspective view illustrating a cooking appliance, according to an embodiment of the disclosure, which is viewed from below.
Figure 3:
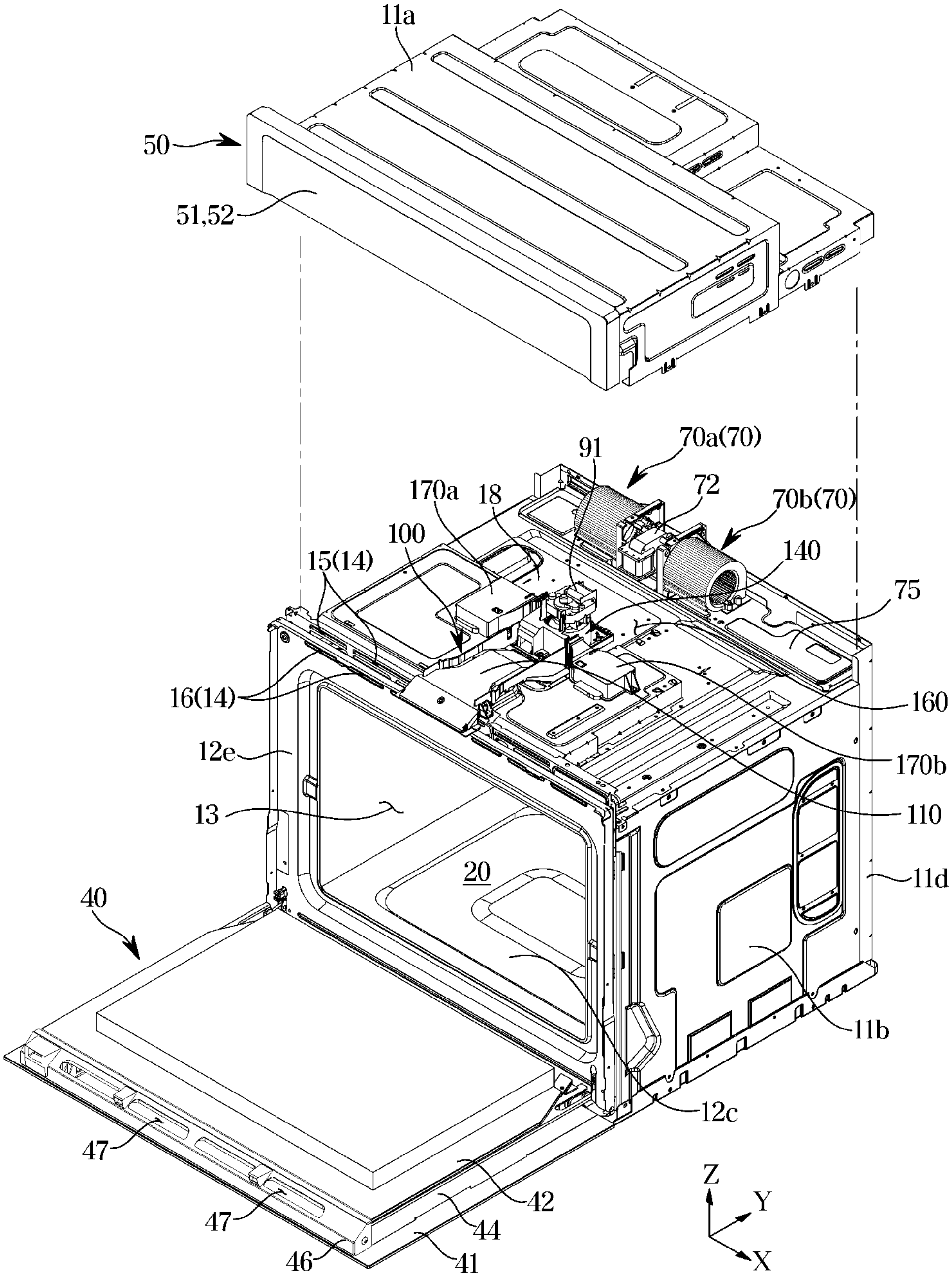
FIG. 3 is an exploded perspective view illustrating a cooking appliance, according to an embodiment of the disclosure.
Figure 4:
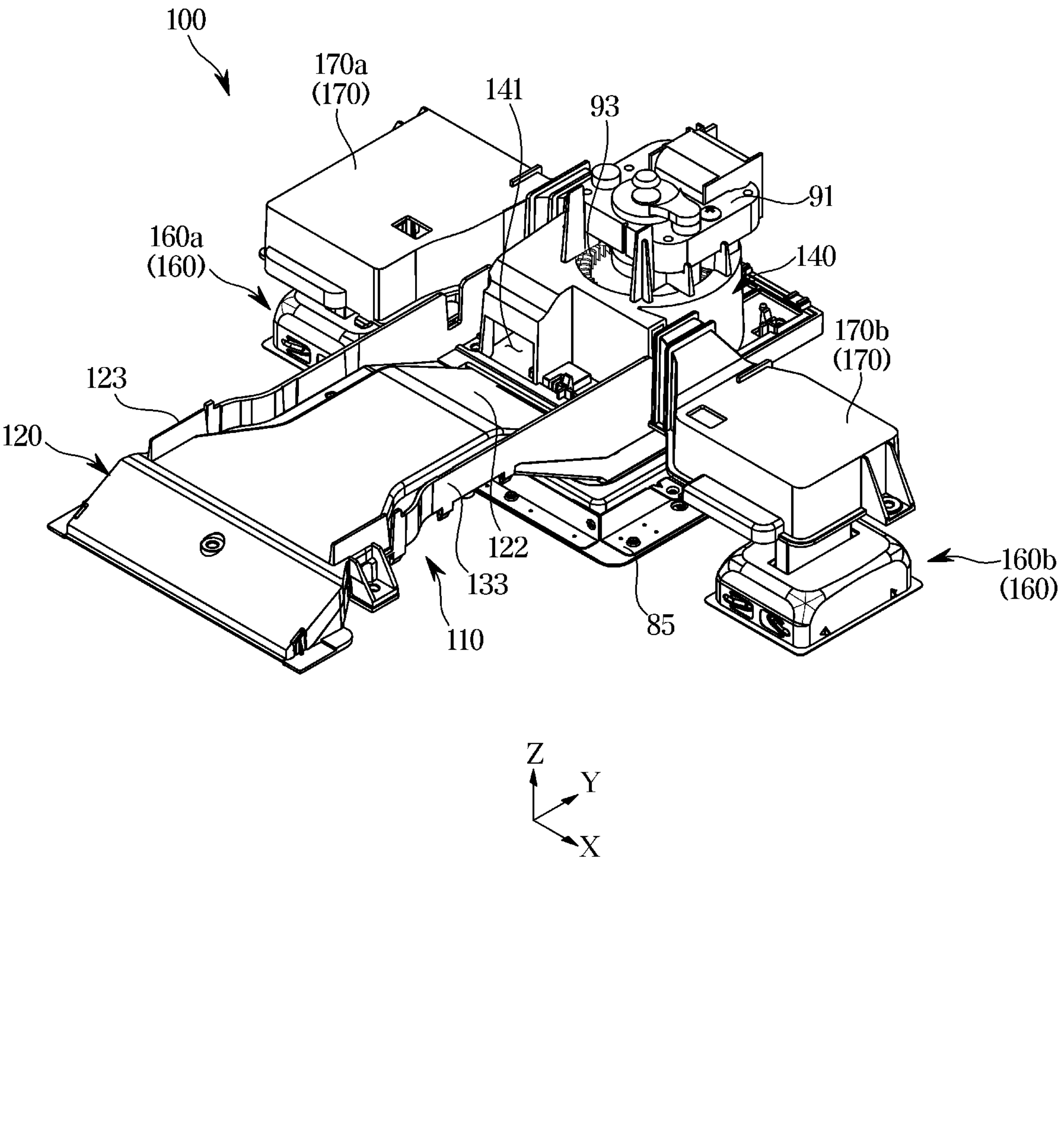
FIG. 4 is a perspective view illustrating an air guide, according to an embodiment of the disclosure.
Figure 5:
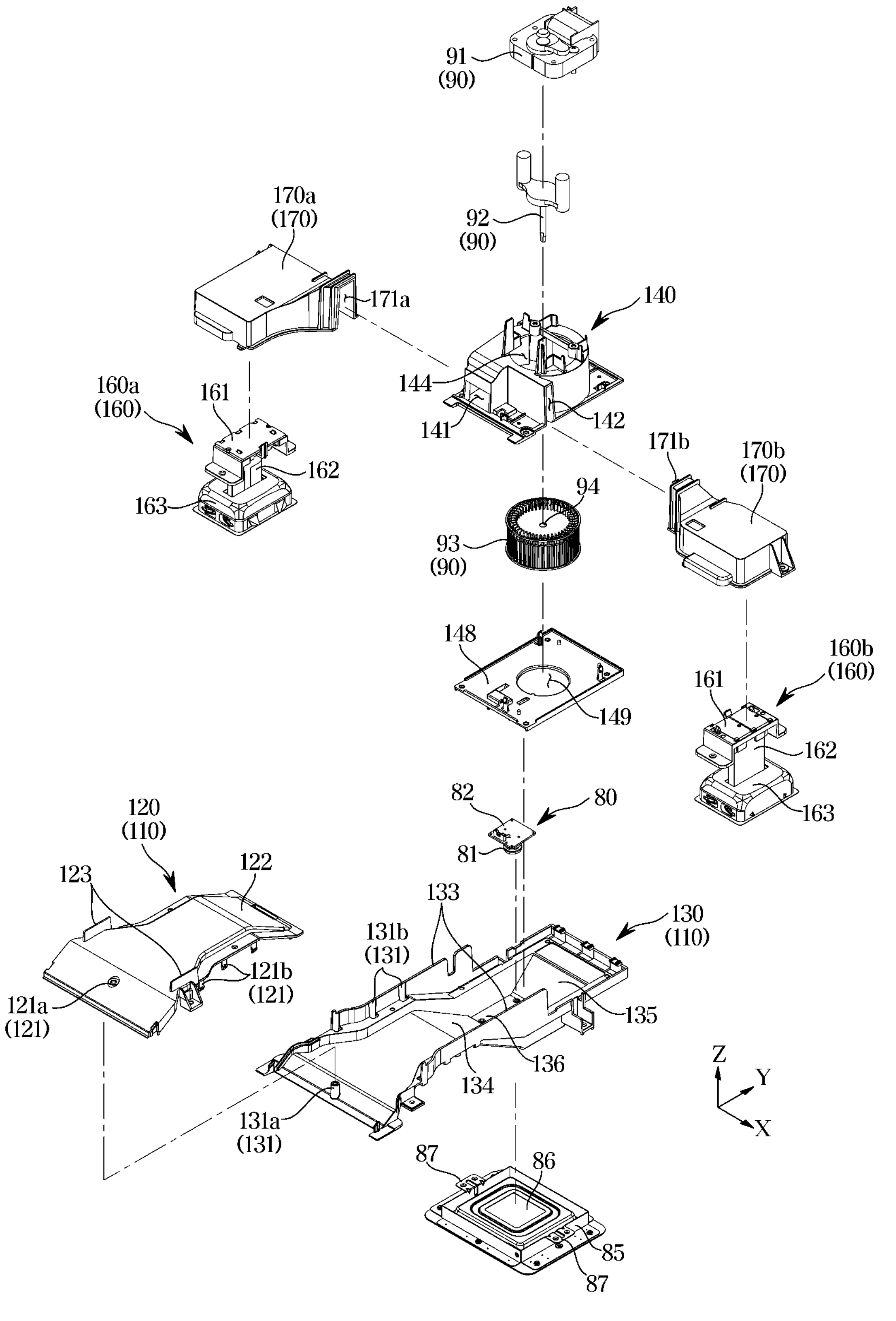
FIG. 5 is an exploded perspective view of an air guide, according to an embodiment of the disclosure.
Figure 6:
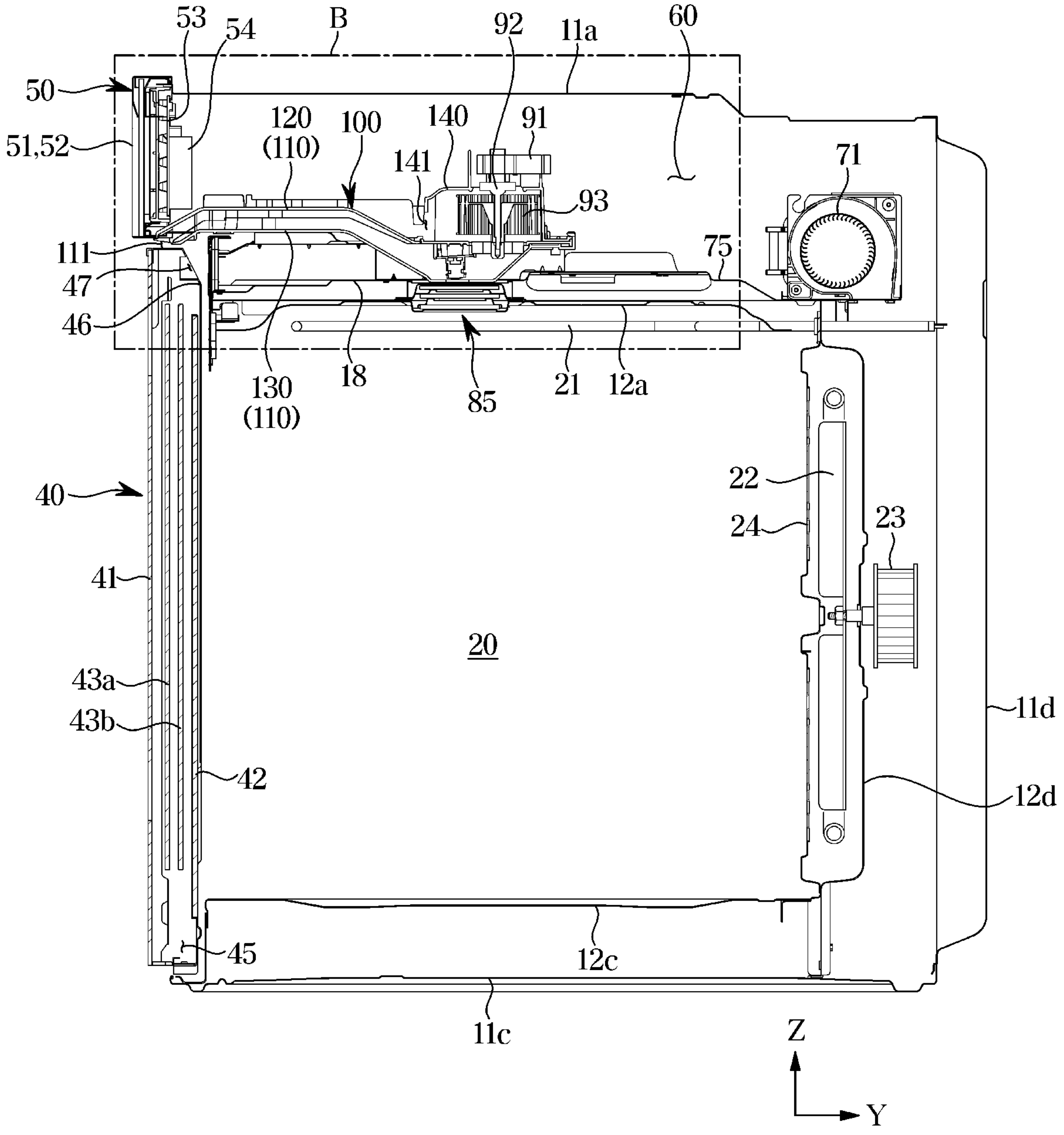
FIG. 6 is a cross-sectional view of the cooking appliance shown in FIG. 1, which is taken along line A-A', according to an embodiment of the disclosure.
Figure 7:
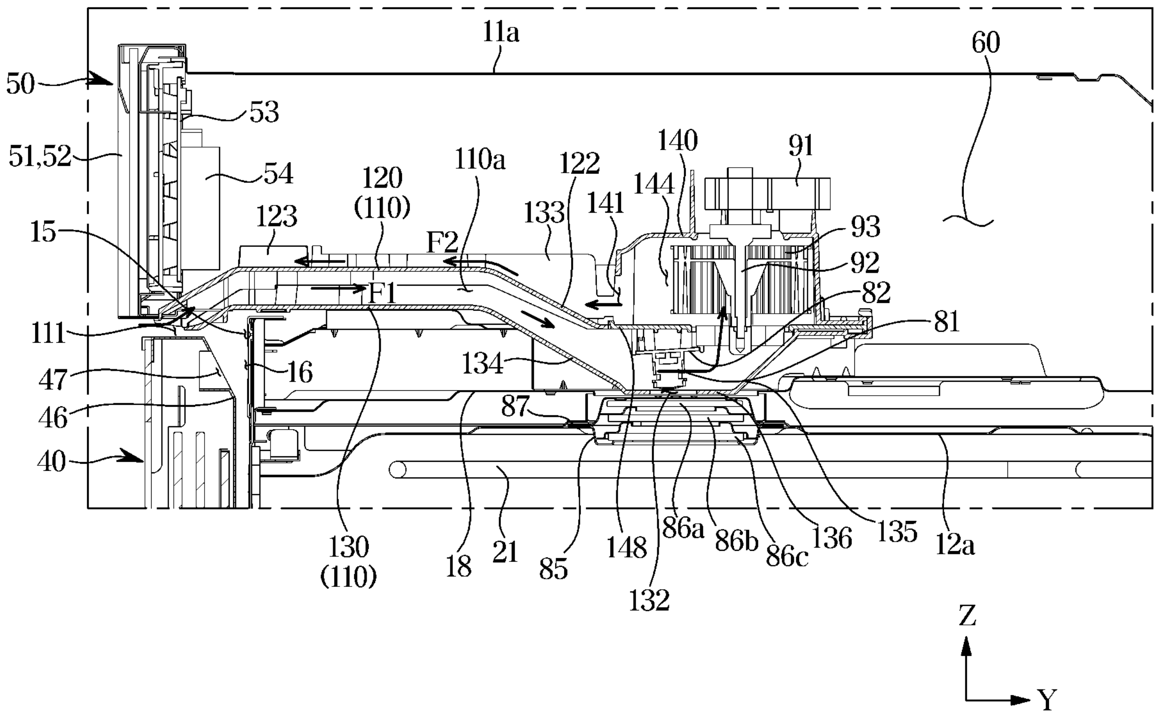
FIG. 7 is an enlarged cross-sectional view of FIG. 6, according to an embodiment of the disclosure.

FIG. 1 is a perspective view illustrating a cooking appliance according to an embodiment of the disclosure. FIG. 2 is a perspective view illustrating a cooking appliance according to an embodiment of the disclosure, which is viewed from below. FIG. 3 is an exploded perspective view illustrating a cooking appliance according to an embodiment of the disclosure. FIG. 4 is a perspective view illustrating an air guide according to an embodiment of the disclosure. FIG. 5 is an exploded perspective view of an air guide according to an embodiment of the disclosure. FIG. 6 is a cross-sectional view of the cooking appliance shown in FIG. 1, which is taken along line A-A'. FIG. 7 is an enlarged cross-sectional view of FIG. 6.

A cooking appliance 1 may be installed inside a wall to have a sense of unity with a kitchen space. That is, the cooking appliance 1 may be a built-in type cooking appliance.

The cooking appliance 1 may include a main body 10. The main body 10 may include an outer cabinet 11 and an inner cabinet 12 provided inside of the outer cabinet 11. The outer cabinet 11 may form the external appearance of the cooking appliance 1.

An upper panel 11*a*, a side panel 11*b*, and a lower panel 11*c* of the outer cabinet 11 may be provided as separate structures and coupled to each other. Alternatively, the upper panel 11*a*, the side panel 11*b*, and the lower panel 11*c* may be integrally formed with each other.

The main body 10 may have a cooking chamber 20 formed inside thereof. The cooking chamber 20 may be provided such that food to be cooked is introduced and cooking of the food proceeds.

The inner cabinet 12 may form the cooking chamber 20. The inner cabinet 12 may include an upper plate 12*a*, a lower plate 12*c*, a side plate 12*b*, and a front plate 12*e*. The upper plate 12*a*, the lower plate 12*c*, the side plate 12*b*, and the front plate 12*e* may be provided as separate structures and coupled to each other. Alternatively, the upper plate 12*a*, the lower plate 12*c*, the side plate 12*b*, and the front plate 12*e* may be integrally formed with each other.

The front plate 12*e* may include an opening portion 13. The opening portion 13 may be provided to allow the front of the cooking chamber 20 to be open. A user may access the cooking chamber 20 through the opening portion 13.

The front plate 12*e* may include a locking portion. The locking portion may be coupled to a door 40. The locking portion may accommodate a door protrusion of the door 40.

The outer cabinet 11 may be provided to cover at least a portion of the inner cabinet 12. For example, the outer cabinet 11 may include an upper panel 11*a* covering the upper plate 12*a* of the inner cabinet 12. The outer cabinet 11 may include a lower panel 11*c* covering the lower plate 12*c* of the inner cabinet 12. The outer cabinet 11 may include a side panel 11*b* covering the side plate 12*b* of the inner cabinet 12.

The cooking chamber 20 may be provided at an inside thereof with a plate in which food may be accommodated and a rack supporting the plate. The rack may be provided to be inserted into and withdrawn from the cooking chamber 20 through an opening of the cooking chamber 20.

The cooking appliance 1 may include the door 40 coupled to the front of the main body 10.

The door 40 may be provided to open and close the cooking chamber 20. The door 40 may be rotatably coupled to the main body 10. The door 40 may be provided to be manually opened or closed based on the door 40 being pressed by the user toward the main body 10. Alternatively, the door 40 may be provided to be automatically opened and closed by electronic control.

In the drawings, the door 40 is illustrated as having no handle, but the disclosure is not limited thereto. For example, the door 40 may include a handle that a user may grip.

The door 40 may include an outer glass 41. The outer glass 41 may form the front appearance of the door 40. The outer glass 41 may be disposed on the same plane as a control panel 50. The surface of the outer glass 41 may be exposed to the user.

The outer glass 41 may have an opaque edge and a transparent center. With such a configuration, the user may see the inside of the cooking chamber 20 from the outside of the door 40.

The cooking appliance 1 may include the control panel 50. The control panel 50 may include a manipulation portion 51 provided such that the user may manipulate the functions of the cooking appliance 1 and a display portion 52 provided to display the status of the cooking appliance 1 to the user.

The control panel 50 may be provided on the front side of the cooking appliance 1 for user convenience, but the disclosure is not limited thereto.

A user may use the manipulation portion 51 to set a heating temperature inside the cooking chamber 20 or a cooking method of food, such as a cooking mode. In the drawing, the manipulation portion 51 is illustrated in the form of a touch display, but the disclosure is not limited thereto. For example, the manipulation portion 51 may be provided in the form of a dial type physical manipulation portion.

The display portion 52 may display various types of information required for the user, such as the temperature inside the cooking chamber 20, the cooking mode of food, and the like.

Referring to FIG. 6, the manipulation portion 51 and/or the display portion 52 may be electrically connected to a control printed circuit board (PCB) 53. When a user manipulates the manipulation portion 51 and inputs a command, an electrical signal may be transmitted to the control PCB 53 such that the function or operation of the cooking appliance 1 may be controlled. In addition, the control PCB 53 may transmit electrical signals to the display portion 52 to display required information to the user.

A heat sink 54 may be disposed on the rear side of the control PCB 53.

Referring to FIG. 6, a circulation fan 22 may be provided inside the cooking chamber 20 such that heat or steam may smoothly flow inside the cooking chamber 20. A circulation fan cover 24 covering the circulation fan 22 may be provided on the front of the circulation fan 22, and the circulation fan cover 24 may be formed with a through hole to allow air to flow.

In FIG. 6, the circulation fan 22 is illustrated as a single circulation fan, but the disclosure is not limited thereto. For example, the circulation fan 22 may be provided as two or more circulation fans 22.

In addition, a heater 21 provided to supply heat for cooking food, a steam inlet provided to introduce steam supplied from a steam supply device, and the like may be provided in the cooking chamber 20. However, the disclosure is not limited thereto, and various components may be provided in the cooking chamber 20 according to the purpose and function of the cooking appliance 1.

Referring to FIG. 2, the cooking appliance 1 may include a camera 81 to photograph the inside of the cooking chamber 20. The user may identify information about food disposed inside the cooking chamber 20 or monitor a cooking state of the food through the camera 81.

The camera 81 may be disposed adjacent to the cooking chamber 20. The camera 81 may be disposed above the cooking chamber 20. The camera 81 may be disposed to face the upper surface of the cooking chamber 20. That is, the camera 81 may be provided above the main body 10 and disposed to easily photograph the inside of the cooking chamber 20.

The cooking appliance 1 may include a lamp module 160 emitting light into the cooking chamber 20. The lamp module 160 may be disposed adjacent to the camera 81.

The lamp module 160 may mainly use light in a visible light range, and may also use light in the infrared region in combination with the light in a visible light range as needed. The lamp module 160 may transmit light of an appropriate wavelength band according to the type of food material inside the cooking chamber 20.

The lamp module 160 may include a light emitting device. The light emitting device may include a light emitting diode (LED). The lamp module 160 may include LEDs such that the camera 81 may photograph the inside of the cooking chamber 20 with a clearer image quality. However, the disclosure is not limited thereto, and the lamp module 160 may be implemented in various forms, such as a halogen lamp.

The lamp module 160 may be disposed adjacent to the cooking chamber 20. The lamp module 160 may be disposed above the cooking chamber 20. The lamp module 160 may be disposed to face the upper surface of the cooking chamber 20. That is, the lamp module 160 may be provided above the main body 10 and disposed to uniformly transmit light into the cooking chamber 20.

The lamp module 160 may be provided in plural. The lamp module 160 may include a first lamp module 160*a* and a second lamp module 160*b* spaced apart from the first lamp module 160*a*. The first lamp module 160*a* and the second lamp module 160*b* may be disposed on the left and right sides of the camera 81, respectively. The camera 81 may be disposed between the first lamp module 160*a* and the second lamp module 160*b*.

Referring to FIGS. 3 and 6, the door 40 may include an inner glass 42. The inner glass 42 may be disposed behind the outer glass 41 to face the cooking chamber 20.

The door 40 may include middle glasses 43*a* and 43*b*. The middle glasses 43*a* and 43*b* may be disposed between the outer glass 41 and the inner glass 42 to reinforce the heat insulating function of the door 40. For example, the middle glasses 43*a* and 43*b* may be provided to block convection of heat from the inner glass 42, which is heated by the heat generated in the cooking chamber 20, to the outer glass 41.

The door 40 may include a door duct 46. The door duct 46 may be arranged between the outer glass 41 and the inner glass 42. The door duct 46 may be provided to allow air flowing between the outer glass 41 and the inner glass 42 to be discharged out of the door 40.

The door duct 46 may be disposed at a rear upper side of the outer glass 41.

The outer glass 41 and the inner glass 42 may be spaced apart from each other in the front-rear direction. A gap may be formed between the outer glass 41 and the inner glass 42. The gap formed between the outer glass 41 and the inner glass 42 may be provided to be open at the lower end of the door 40.

That is, the door 40 may be provided at a lower end thereof with a door suction duct inlet 111 such that air is drawn.

Therefore, external air is introduced through the lower end of the door 40 and flows inside the door 40, thereby the door 40 from being heated by the heat generated from the cooking chamber 20. Specifically, the external air introduced through the lower end of the door 40 may flow between the inner glass 42 and the outer glass 41, so that the heat of the inner glass 42, which is directly heated by the heat of the cooking chamber 20, is prevented from being transferred to the outer glass 41 by convection.

Therefore, the external air introduced through the lower end of the door 40 may be discharged back through an upper end of the door 40. For example, external air introduced through the lower end of the door 40 may be discharged to the outside of the door 40 through a door outlet 47 of the door duct 46 disposed on an upper portion of the door 40.

The door 40 may include a door frame 44. The door frame 44 may be mounted on a rear surface of the outer glass 41 to support the door duct 46 and the inner glass 42 at the lateral side.

Referring to FIGS. 2 and 3, the front plate 12*e* may include a cabinet inlet 14. Air may be introduced into the main body 10 through the cabinet inlet 14.

The cabinet inlet 14 may be provided in an upper portion of the front plate 12*e*. The cabinet inlet 14 may extend in a left-right direction. The cabinet inlet 14 may be provided in plural.

The cabinet inlet 14 may include a first inlet 15 and a second inlet 16 spaced apart from the first inlet 15. The first inlet 15 may be disposed at the upper side of the second inlet 16.

The first inlet 15 may allow for intake of air outside of the cooking appliance 1 thereinto. The first inlet 15 may be open toward the outside even in a state in which the cooking chamber 20 is closed by the door 40. Therefore, external air may be introduced into the main body 10 through the first inlet 15.

The air introduced through the first inlet 15 may move to an electronic equipment chamber 60 and cool the electronic equipment chamber 60. Specifically, various electric components provided inside the electronic equipment chamber 60 may be cooled.

The second inlet 16 may allow for inflow of air passing through the door 40 thereinto. Specifically, air drawn into a door inlet 45 and passing through the inside of the door 40 and discharged through the door outlet 47 may flow into the second inlet 16. The air introduced to the second inlet 16 may move into a space between the cooking chamber 20 and the electronic equipment chamber 60.

The air drawn into the second inlet 16 may insulate the electronic equipment chamber 60 and the cooking chamber 20 to prevent heat from the cooking chamber 20 from being transferred to the electronic equipment chamber 60.

A heat insulating material may be provided in the space between the cooking chamber 20 and the electronic equipment chamber 60 to insulate the electronic equipment chamber 60 and the cooking chamber 20.

The heat insulating material may not only be provided between the electronic equipment chamber 60 and the cooking chamber 20, but also entirely cover the outside of the cooking chamber 20 to prevent heat of the cooking chamber 20 from being transferred to the outside of the cooking appliance 1.

Referring to FIG. 6, the electronic equipment chamber 60 may be provided inside the main body 10 and divided from the cooking chamber 20 by a partition plate 18.

The electronic equipment chamber 60 may be provided in an upper portion of the main body 10. The electronic equipment chamber 60 may be disposed above the cooking chamber 20. The upper panel 11*a* of the outer cabinet 11 may be disposed on the upper side of the electronic equipment chamber 60 to form an upper surface of the electronic equipment chamber 60, and the partition plate 18 may be disposed on the lower side of the electronic equipment chamber 60 to forma lower surface of the electronic equipment chamber 60.

However, the disclosure is not limited thereto, and the electronic equipment chamber 60 may be provided in a side portion of the main body 10.

Electric component inside the electronic equipment chamber 60, provided may be electric components, such as a main PCB for performing functions of the cooking appliance 1. Electric components including the main PCB may be supplied with power from an external power source or connected to each other through wires.

Electric components may be supported by the partition plate 18. However, the disclosure is not limited thereto, and the partition plate 18 may be omitted, and electric components may be seated on the upper plate 12*a* of the inner cabinet 12.

The cooking appliance 1 may include a main cooling fan assembly 70. The main cooling fan assembly 70 may generate a flow of air. A main cooling fan 71 may be provided to intake air from the outside of the main body 10.

The main cooling fan 71 may form a flow of air such that external air is drawn into the cabinet inlet 14 of the front plate 12*e*.

The main cooling fan assembly 70 may generate a flow of air such that air drawn into the first inlet 15 of the cabinet inlet 14 cools the inside of the electronic equipment chamber 60.

The main cooling fan assembly 70 may generate a flow of air such that air drawn into the second inlet 16 of the cabinet inlet 14 performs an insulation function between the electronic equipment chamber 60 and the cooking chamber 20.

Thereafter, the air drawn into the main cooling fan assembly 70 may be discharged to the lower rear side, and pass through a space between the rear plate 12*d* of the inner cabinet 12 and the rear panel 11*d* of the outer cabinet 11 to cool the circulation fan 22 and the like. Air discharged from the main cooling fan 71 may move from top to bottom in the space between the rear plate 12*d* and the rear panel 11*d*.

Thereafter, the air may move to a region between the lower plate 12*c* and the lower panel 11*c*, and then move forward from the rear side. Then, the air may be discharged to the outside through the front lower end of the cooking appliance 1. That is, since the air is discharged to the outside toward the front of the cooking appliance 1, even when the cooking appliance 1 is provided in a built-in type, hot exhaust air is prevented from contacting the cooking appliance 1.

The main cooling fan assembly 70 may be provided in plural. The main cooling fan assembly 70 may include a first main cooling fan assembly 70*a* and a second main cooling fan assembly 70*b*.

The first main cooling fan assembly 70*a* and the second main cooling fan assembly 70*b* may be arranged in a left-right direction. The first main cooling fan assembly 70*a* and the second main cooling fan assembly 70*b* may be arranged along an axial direction. The first main cooling fan assembly 70*a* and the second main cooling fan assembly 70*b* may be provided as a pair.

The main cooling fan 71 may be provided as a centrifugal fan. The main cooling fan 71 may intake air in the axial direction and discharge air in a radial direction.

The main cooling fan assembly 70 may include a main cooling fan 71 and a main cooling fan motor 72 transmitting power to the main cooling fan 71. The main cooling fan motor 72 may drive the main cooling fan 71 of the first main cooling fan assembly 70*a* and/or the second main cooling fan assembly 70*b*. In this case, the main cooling fan motor 72 may connect the main cooling fan 71 of the first main cooling fan assembly 70*a* to the main cooling fan 71 of the second main cooling fan assembly 70*b*.

The cooking appliance 1 may include a processor, a memory, and the like. The processor may be electrically or operatively connected to the memory. The processor may control components of the cooking appliance 1 using information and computer executable instructions stored in the memory of the cooking appliance 1. For example, when the user operates through the manipulation portion 51 provided on the control panel 50, the processor may control the heater 21 and the like to cook food.

As another example, the cooking appliance 1 may recognize information about food and a cooking state based on an image photographed by the camera 81 and automatically cook the food.

The processor may control the camera 81 and/or the lamp module 160 to photograph the inside of the cooking chamber 20. Images photographed by the camera 81 may be stored in the memory of the cooking appliance 1. The processor of the cooking appliance 1 may execute computer executable instructions stored in the memory to acquire information about the type of ingredients through vision recognition based on a photographed image of the ingredients. Thereafter, the processor may control the cooking process of the ingredients accordingly. Specifically, the cooking process of ingredients may be controlled by determining at least one of a cooking method, a cooking time, or a cooking temperature.

The processor may be manufactured in the form of a hardware chip for artificial intelligence (AI). The processor may be implemented using a printed circuit board (e.g., a printed circuit board (PCB), a printed board assembly (PBA), a flexible PCB (FPCB), a rigid-flexible PCB (RFPCB), or the like, and the printed circuit board may be mounted on a control PCB 53 mounted on the control panel 50 or/and a main PCB.

The lamp module 160 may be disposed to face the upper surface of the cooking chamber 20. Specifically, the upper plate 12*a* forming the upper surface of the cooking chamber 20 may include an opening, and the lamp module 160 may be disposed above the opening to face the cooking chamber 20.

The camera 81 may be disposed to face the upper surface of the cooking chamber 20. Specifically, the upper plate 12*a* forming the upper surface of the cooking chamber 20 may include an opening, and the camera 81 may be disposed above the opening to face the cooking chamber 20.

The camera 81 may be provided outside of the inner cabinet 12. The camera 81 may be provided outside of the cooking chamber 20. The camera 81 may be disposed inside of the control chamber 60.

The camera 81 may be installed on a holder 85. The holder 85 may be coupled to the opening formed in the partition plate 18 and/or the upper plate 12*a*.

The holder 85 may be disposed on the lower side of the camera module 80. The holder 85 may be mounted on the inner cabinet 12 by a holder mounting portion 87. The holder mounting portion 87 may be coupled to the upper plate 12*a*. The holder 85 may be fixed to the upper portion of the cooking chamber 20.

The holder 85 may have a glass 86 mounted thereon. The glass 86 insulates between the cooking chamber 20 and the electronic equipment chamber 60, thereby preventing the camera 81 from being damaged due to temperature of the camera 81 rising.

The glass 86 may be formed of a transparent material. With such a configuration, the camera 81 may photograph the inside of the cooking chamber 20 even from the top of the glass 86.

The glass 86 may include a first glass 86*a*, a second glass 86*b*, and a third glass 86*c*. The first glass 86*a*, the second glass 86*b*, and the third glass 86*c* may be spaced apart from each other by a predetermined distance.

The first glass 86*a* may be mounted in the opening provided on the upper side of the cooking chamber 20. The second glass 86*b* may be disposed on the upper side of the first glass 86*a*. The third glass 86*c* may be disposed on the upper sider of the second glass 86*b*. The camera 81 may be disposed on the upper side of the third glass 86*c*.

On the other hand, in the drawings, the glass 86 is illustrated as being provided as three glasses, but the disclosure is not limited thereto. For example, the glass 86 may be provided in two or less or four or more of glasses.

The cooking appliance 1 may include a camera cooling fan 93.

During the cooking process, the temperature inside the cooking chamber 20 may be maintained at a high temperature. Since the camera 81 may be disposed adjacent to the cooking chamber 20 to photograph the inside of the cooking chamber 20, the temperature of the camera 81 may rise, which may damage the camera 81. To prevent the temperature of the camera 81 from rising, the cooking appliance 1 may include the camera cooling fan 93.

The camera cooling fan 93 may be disposed above the camera 81. The camera cooling fan 93 may cool the camera 81 by intaking external air. The camera cooling fan 93 may include a sirocco fan. The camera cooling fan 93 may intake external air from the front upper side of the cooking chamber 20.

A camera cooling fan motor 91 may be coupled to a camera cooling fan motor shaft 92. The camera cooling fan motor shaft 92 may be inserted into a through hole 94 provided in an exhaust duct 140. The camera cooling fan 93 may be disposed inside the exhaust duct 140. The camera cooling fan motor shaft 92 may be connected to the camera cooling fan 93.

The camera cooling fan 93 may be rotated by the driving force of the camera cooling fan motor 91.

Referring to FIGS. 4 to 7, the cooking appliance 1 may include an air guide 100. The air guide 100 may be provided to form a flow path. The air guide 100 may be provided to form a flow path through which external air is drawn into the main body 10 to cool the main body 10.

The air guide 100 may be provided in the main body 10. The air guide 100 may be disposed on the upper side of the cooking chamber 20. The air guide 100 may be disposed in the electronic equipment chamber 60. The air guide 100 may be disposed on the upper side of the partition plate 18.

The air guide 100 may be provided to form a flow path in the electronic equipment chamber 60. The air guide 100 may be provided to generate a flow of air inside the electronic equipment chamber 60 to cool the electronic equipment chamber 60. The air guide 100 may guide air to cool various electric components including the camera 81, the lamp module 160, and the like.

The air guide 100 may include a suction duct 110. The suction duct 110 may be provided such that external air is drawn into the main body 10. The suction duct 110 may be provided such that air is drawn into the electronic equipment chamber 60. The suction duct 110 may form a suction flow path 110*a* through which air moves.

The suction duct 110 may include a suction duct inlet 111. The suction duct inlet 111 may be provided such that external air is drawn into the suction duct 110. Air outside the main body 10 may be drawn into the suction duct inlet 111 by the camera cooling fan 93 and/or the main cooling fan 71 disposed inside the main body 10.

The suction duct inlet 111 may be disposed on the front of the suction duct 110. The suction duct inlet 111 may be provided on the front of the main body 10. The suction duct inlet 111 may be provided on the lower side of the control panel 50. The suction duct inlet 111 may be provided between the door 40 and the control panel 50.

The suction duct inlet 111 may be exposed to the outside even when the cooking chamber 20 is closed by the door 40. Therefore, external air may be drawn into the suction duct 110 through the suction duct inlet 111.

The suction duct inlet 111 may be formed to extend in the left-right direction.

The camera 81 may be disposed inside the suction duct 110. Air moving through the suction flow path 110*a* may be drawn to the camera 81. The air may cool the camera 81 while passing through the camera 81.

The suction duct 110 may include an upper housing 120 and a lower housing 130 disposed on the lower side of the upper housing 120. The suction flow path 110*a* may be formed between the upper housing 120 and the lower housing 130.

The upper housing 120 and the lower housing 130 may be coupled to each other. An upper housing coupling portion 121 and a lower housing coupling portion 131 may be provided to correspond to each other. A coupling hole 121*a* of the upper housing 120 may correspond to a coupling protrusion 131*a* of the lower housing 130. A coupling hook 121*b* of the upper housing 120 may be inserted into a coupling groove 131*b* of the lower housing 130.

In the drawing, the upper housing 120 and the lower housing 130 are illustrated as being provided separately and coupled to each other, but the disclosure is not limited thereto. For example, the upper housing 120 and the lower housing 130 may be integrally formed with each other.

The lower housing 130 may include a first inclined surface 134, a second inclined surface 135 disposed at the rear of the first inclined surface 134, and a connection surface 136 disposed between the first inclined surface 134 and the second inclined surface 135. The connection surface 136 may be provided as a flat shape.

The connection surface 136 may include a through hole 132. The camera 81 may be positioned to face the through hole 132. The through hole 132 may be provided for the camera 81 to photograph the inside of the cooking chamber 20.

The first inclined surface 134 may be provided to obliquely face downward as the distance from the connection surface 136 decreases. The first inclined surface 134 may be obliquely face downward in a direction toward the rear side. The first inclined surface 134 may guide air passing through the suction flow path 110*a* toward the camera 81.

The second inclined surface 135 may be provided to obliquely face upward as the distance from the connection surface 136 increases. The second inclined surface 135 may obliquely face upward in a direction toward the rear side. The second inclined surface 135 may guide air passing through the camera 81 to be directed toward the camera cooling fan 93. The second inclined surface 135 may guide air passing through the suction duct 110 to be directed toward the exhaust duct 140.

The first inclined surface 134 and the second inclined surface 135 may be formed to face each other. The first inclined surface 134 and the second inclined surface 135 may be formed symmetrically with respect to the connection surface 136.

The upper housing 120 may include a guide surface 122 corresponding to the first inclined surface 134 of the lower housing 130. The guide surface 122 may obliquely face downward in a direction toward the rear side. The guide surface 122 may guide air passing through the suction flow path 110*a* to be directed toward the camera 81.

The air guide 100 may include the exhaust duct 140. The exhaust duct 140 may be connected to the suction duct 110. The exhaust duct 140 may be provided such that air drawn into the suction duct 110 is discharged to the electronic equipment chamber 60. The air discharged through the exhaust duct 140 may cool the electronic equipment chamber 60. The exhaust duct 140 may form an exhaust flow path 140*a* through which air may move.

The exhaust duct 140 may be connected to the suction duct 110. The exhaust duct 140 may be provided to cover an upper portion of the lower housing 130 of the suction duct 110.

The exhaust duct 140 may form the exhaust flow path 140*a*. The exhaust flow path 140*a* may be connected to the suction flow path 110*a*. The exhaust flow path 140*a* may be disposed downstream of the suction flow path 110*a*.

The camera cooling fan 93 may be disposed inside the exhaust duct 140. The exhaust duct 140 may include an accommodating portion 144 provided to accommodate the camera cooling fan 93. The accommodating portion 144 may be provided to correspond to the shape of the camera cooling fan 93. For example, the accommodating portion 144 may be provided in the shape of a hollow cylinder.

The exhaust duct 140 may include outlets 141, 142, and 143. The outlets 141, 142, and 143 may be provided such that external air drawn into the suction duct 110 is discharged toward the electronic equipment chamber 60. A plurality of the outlets 141, 142, and 143 may be provided. The outlets 141, 142, and 143 may be open in various directions.

The outlets 141, 142, and 143 may include a front outlet 141. The front outlet 141 may be open toward the front of the main body 10. The front outlet 141 may be open toward the control panel 50. The front outlet 141 may be open toward the control PCB 53 mounted on the rear surface of the control panel 50.

The front outlet 141 may be provided in a substantially rectangular shape. However, the disclosure is not limited thereto, and the front outlet 141 may be provided in various shapes, such as a circular shape.

Air discharged through the front outlet 141 may move toward the front of the main body 10. The air may move inside the electronic equipment chamber 60 and may move toward the control panel 50. Accordingly, electric components disposed inside the electronic equipment chamber 60 may be cooled, and the control PCB 53 mounted on the control panel 50 may be cooled.

The suction duct 110 may be disposed adjacent to the front outlet 141. The suction duct 110 may be provided to guide air discharged through the front outlet 141. The air discharged through the front outlet 141 may be guided to the control PCB 53 by the suction duct 110.

The upper housing 120 of the suction duct 110 may include the guide surface 122. The guide surface 122 may be disposed adjacent to the front outlet 141. The guide surface 122 may be provided at the rear of the suction duct 110.

The guide surface 122 may be obliquely formed. The guide surface 122 may be provided to obliquely face upward as the distance from the front outlet 141 increases. The guide surface 122 may be provided with an upward slope toward the front.

The guide surface 122 may guide the air discharged through the front outlet 141 upward. The air discharged through the front outlet 141 may easily move to the control PCB 53 along the guide surface 122.

The air guide 100 may include guide sidewalls 123 and 133. The suction duct 110 may include the guide sidewalls 123 and 133. The guide sidewalls 123 and 133 may guide the air discharged through the front outlet 141 to the control PCB 53.

The guide sidewalls 123 and 133 may be provided in a plate shape. The guide sidewalls 123 and 133 may be disposed on the lateral sides of the suction duct 110. Each of the guide sidewalls 123 and 133 may be provided as a pair on both sides of the suction duct 110.

The guide sidewalls 123 and 133 may include first guide sidewalls 123 provided on the upper housing 120. The first guide sidewalls 123 may protrude upward from the upper housing 120. The first guide sidewalls 123 may be provided on the lateral sides of the upper housing 120.

The guide sidewalls 123 and 133 may include second guide sidewalls 133 provided on the lower housing 130. The second guide sidewalls 133 may protrude upward from the lower housing 130. The second guide sidewalls 133 may be provided on the lateral sides of the lower housing 130.

As the upper housing 120 and the lower housing 130 are coupled, the first guide sidewalls 123 may be connected to the second guide sidewalls 133. However, the disclosure is not limited thereto, and the first guide sidewall 123 and the second guide sidewall 133 may be integrally formed with each other.

Air discharged through the front outlet 141 may be guided toward the center of the control panel 50 by the guide sidewalls 123 and 133. The air moved to the center of the control panel 50 may be branched in the left and right directions to evenly cool the entire area of the control PCB 53.

The air guide 100 may be disposed approximately at the center of the electronic equipment chamber 60. The camera 81 may be disposed approximately at the center of the upper side of the cooking chamber 20. The suction duct inlet 111 may be disposed substantially at the center of the lower side of the control panel 50.

Accordingly, the suction duct 110 may be disposed at the rear of the inlet provided in the central portion of the first inlet 15 of the cabinet inlet 14. Therefore, it may be difficult for air to be drawn into the central portion of the first inlet 15, which may cause a difficult in cooling the control PCB 53.

Accordingly, the front outlet 141 may be open toward the center of the control PCB 53, and the guide sidewalls 123 and 133 may guide the air toward the center of the control PCB 53 such that the control PCB 53 may be cooled.

Referring to FIG. 7, air F1 drawn through the suction duct inlet 111 of the air guide 100 may move along the suction flow path 110*a* inside the suction duct 110 to cool the camera 81, after which the air may flow out through the front outlet 14 of the exhaust duct 140, and move toward the control PCB 53 of the control panel 50 as a flow of air F2.

Figure 8:
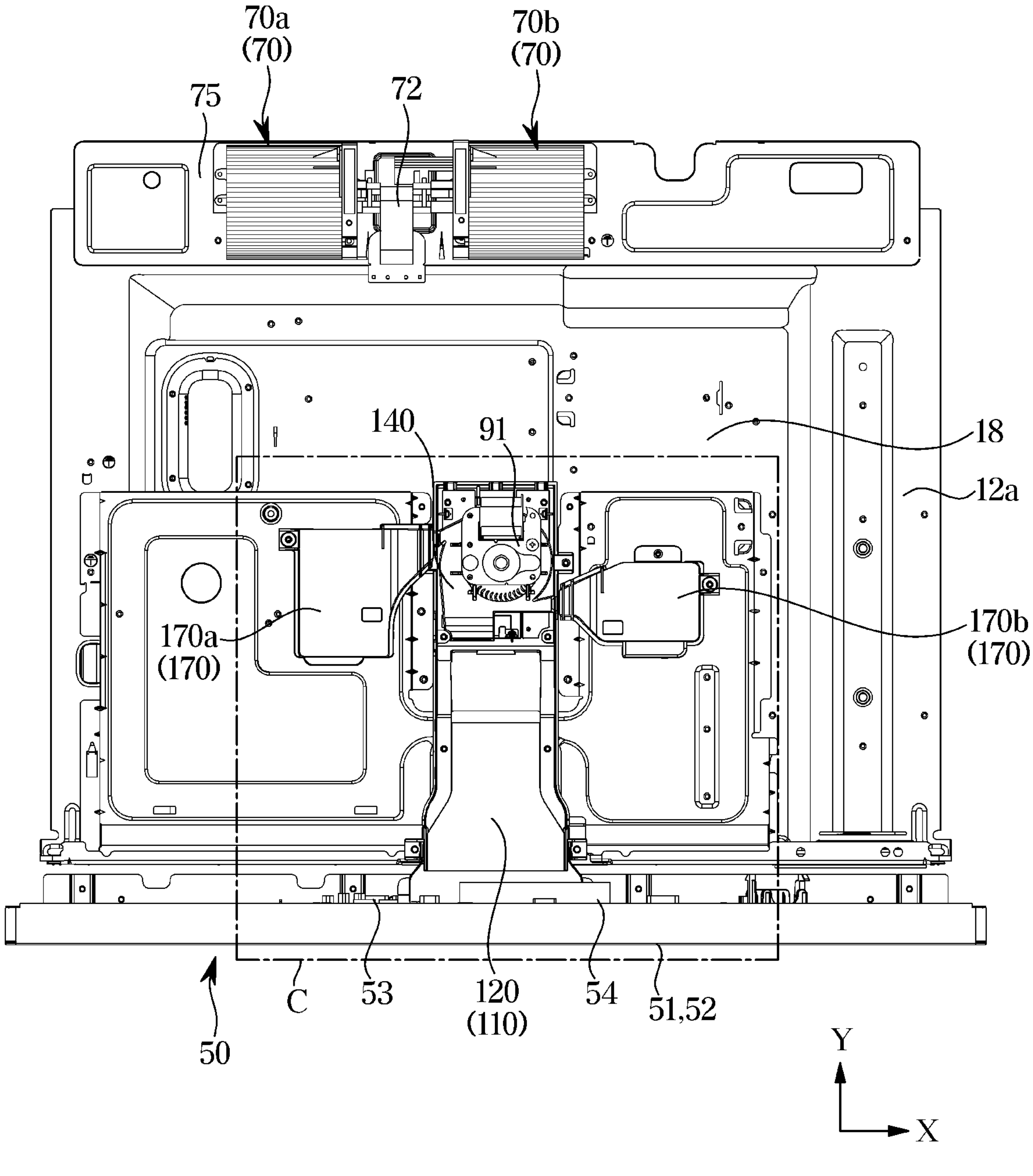
FIG. 8 is a top view of a cooking appliance according to an embodiment of the disclosure.
Figure 9:
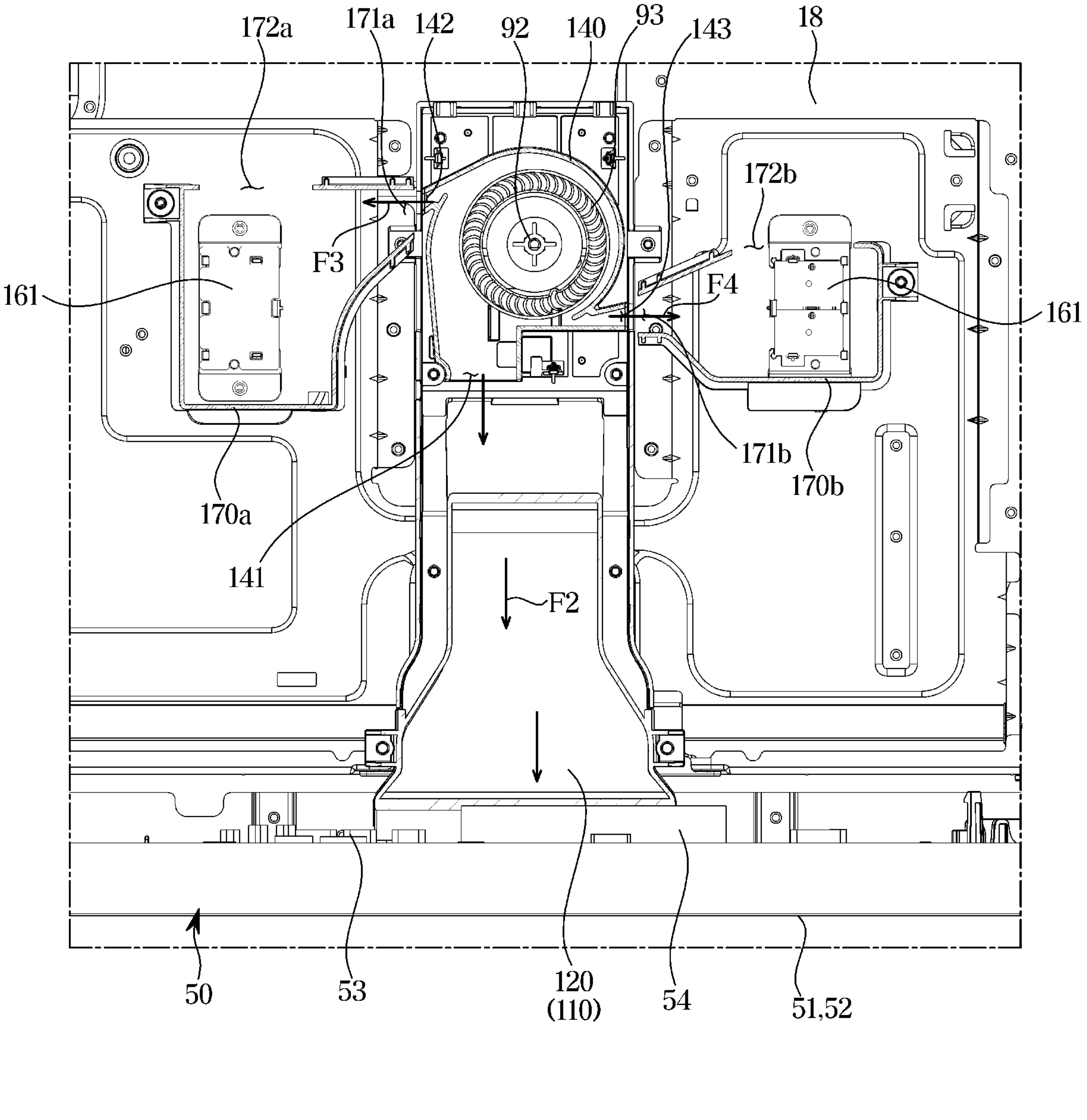
FIG. 9 is an enlarged cross-sectional view of the cooking appliance shown in FIG. 8, according to an embodiment of the disclosure.
Figure 10:
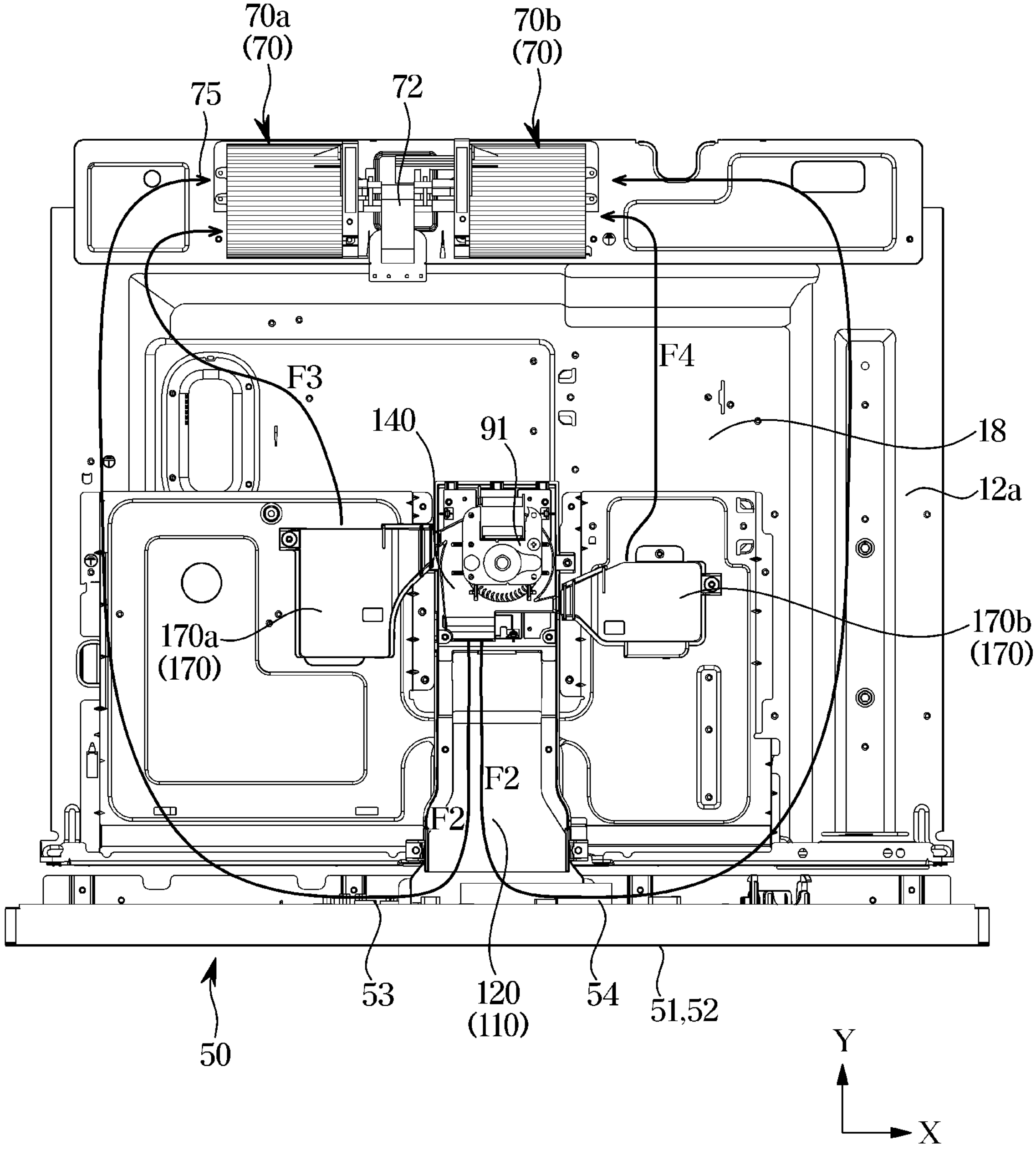
FIG. 10 is a view illustrating a flow of air in a cooking appliance, according to an embodiment of the disclosure, which is viewed from the top.

FIG. 8 is a top view of a cooking appliance according to an embodiment of the disclosure. FIG. 9 is an enlarged cross-sectional view of the cooking appliance shown in FIG. 8. FIG. 10 is a view illustrating a flow of air in a cooking appliance according to an embodiment of the disclosure, which is viewed from the top.

The outlets 141, 142, and 143 may include lamp outlets 142 and 143. The lamp outlets 142 and 143 may be provided such that air introduced into the suction duct 110 is discharged toward the lamp module 160. The lamp outlets 142 and 143 may be open toward the lamp module 160. The lamp outlets 142 and 143 may be open toward the lateral side of the exhaust duct 140.

The lamp outlets 142 and 143 may be provided in a substantially quadrangular shape. The lamp outlets 142 and 143 may be smaller than the front outlet 141. However, the disclosure is not limited thereto, and the lamp outlets 142 and 143 may be provided in various shapes and sizes.

Air discharged through the lamp outlets 142 and 143 may move toward the lamp module 160. The air may move toward the lamp module 160 and cool the lamp module 160.

The lamp outlets 142 and 143 may include a first lamp outlet 142 opening toward the first lamp module 160*a* and a second lamp outlet 143 opening toward the second lamp module 160*b*. The first lamp outlet 142 and the second lamp outlet 143 may be spaced apart from each other. The first lamp outlet 142 and the second lamp outlet 143 may be open in the opposite directions. The front outlet 141 may be disposed between the first lamp outlet 142 and the second lamp outlet 143.

The air guide 100 may include a lamp guide duct 170 provided to guide air discharged from the lamp outlets 142 and 143 to the lamp module 160. The lamp guide duct 170 may be provided to cover the lamp module 160.

The lamp guide duct 170 may include a first lamp guide duct 170*a* corresponding to the first lamp module 160*a* and a second lamp guide duct 170*b* corresponding to the second lamp module 160*b*.

The lamp guide duct 170 may include a lamp guide duct inlet 171 through which air is drawn and a lamp guide duct outlet 172 through which air is discharged.

The lamp guide duct inlet 171 may be connected to the lamp outlets 142 and 143 to intake air from the exhaust duct 140. The air drawn into the lamp guide duct 170 may cool the lamp module 160 accommodated inside the lamp guide duct 170 and then flow out through the lamp guide duct outlet 172. Then, the air may move toward the main cooling fan 71.

The lamp guide duct outlet 172 may be open toward the main cooling fan 71. The lamp guide duct outlet 172 may be open toward the rear of the main body 10. The lamp guide duct outlet 172 may be disposed adjacent to the main cooling fan 71. Accordingly, the air drawn into the lamp guide duct 170 may be easily discharged through the lamp guide duct outlet 172 by the suction force of the main cooling fan 71.

Referring to FIGS. 9 and 10, the flows of air F2, F3, and F4 discharged by the air guide 100 move forward, leftward, and rightward, respectively, and then move backward by the suction force of the main cooling fan 71.

The front outlet 141 may be larger than the lamp outlets 142 and 143. Therefore, more of air inside the exhaust duct 140 may be discharged through the front outlet 141 than through the lamp outlets 142 and 143, and components disposed on the front, such as the control PCB 53, may be easily cooled.

Although the drawing illustrates the cooking appliance 1 having one cooking chamber 20, the disclosure is not limited thereto. For example, the cooking appliance 1 may include an upper cooking chamber and a lower cooking chamber, and may be implemented in the form of a double oven in which each cooking chamber is separately controlled. The camera 81 may be arranged to photograph only the inside of the upper cooking chamber, or a plurality of cameras 81 may be provided and arranged to photograph both the upper cooking chamber and the lower cooking chamber.

According to an aspect of the disclosure, since a camera and a lamp are allowed to be disposed above a cooking chamber, the inside of the cooking chamber can be easily photographed.

According to an aspect of the disclosure, since electric components are efficiently cooled, damage to the components can be prevented.

According to an aspect of the disclosure, since arrangement of electric components is facilitated, space utilization can be improved.

The effects of the disclosure are not limited to those described above, and other effects not described above will be clearly understood by those skilled in the art from the above detailed description.

Details of a cooking appliance have been described above with reference to the accompanying drawings, but the disclosure may be variously modified and changed by those skilled in the art, and the modifications and changes should be interpreted as being included in the scope of the disclosure.

What is claimed is:

1. A cooking appliance comprising:
- a main body including a cooking chamber;
- a door positioned at a front of the main body configured to open and close the cooking chamber;
- a camera disposed toward the cooking chamber configured to obtain a photograph of an inside of the cooking chamber;
- a camera cooling fan configured to intake external air to cool the camera;
- a lamp disposed toward the cooking chamber and configured to provide light into the cooking chamber; and
- an air guide configured to form a flow path such that the external air is provided toward the camera by the camera cooling fan, the air guide configured to guide air passed through the camera to be discharged toward a front of the camera cooling, wherein the air guide comprises:
- a suction duct in which the camera is provided, the suction duct being configured to form a suction flow path of air; and
- an exhaust duct connected to the suction duct, the camera cooling fan is provided in the exhaust duct, and the exhaust duct is configured to form an exhaust flow path of air, and wherein the exhaust duct includes a front outlet that is open toward the front of the camera cooling fan, and lamp outlets that are open toward the lamp.

2. The cooking appliance of claim 1, wherein the suction duct includes an upper housing and a lower housing provided on a lower side of the upper housing, and wherein the upper housing is adjacent to the front outlet and is configured to guide the air discharged from the front outlet.

3. The cooking appliance of claim 2, wherein the upper housing includes a guide surface obliquely facing upward in a direction forward from the front outlet.

4. The cooking appliance of claim 1, further comprising a control panel formed on the front of the main body and on which a printed circuit board (PCB) is mounted, wherein the front outlet is open toward the control panel.

5. The cooking appliance of claim 4, wherein the air guide further includes guide sidewalls configured to guide the air discharged from the front outlet toward the PCB.

6. The cooking appliance of claim 1, wherein the front outlet is larger than the lamp outlets.

7. The cooking appliance of claim 1, wherein the air guide further includes a lamp guide duct configured to guide the air discharged from the lamp outlets toward the lamp.

8. The cooking appliance of claim 7, wherein the lamp guide duct includes lamp guide duct inlets connected to the lamp outlets and lamp guide duct outlets through which air drawn to the lamp guide duct inlets is discharged.

9. The cooking appliance of claim 8, further comprising a main cooling fan arranged at a rear of the air guide, wherein the lamp guide duct outlets are open toward the main cooling fan.

10. The cooking appliance of claim 1, wherein the lamp comprises a first lamp and a second lamp spaced apart from the first lamp, and wherein the lamp outlets comprise a first lamp outlet opening toward the first lamp, and a second lamp outlet opening toward the second lamp.

11. The cooking appliance of claim 10, wherein the first lamp outlet and the second lamp outlet are open in opposite directions.

12. The cooking appliance of claim 10, wherein the front outlet is provided between the first lamp outlet and the second lamp outlet.

13. A cooking device comprising:
- a cooking chamber;
- a door configured to open and close the cooking chamber;
- a camera disposed toward the cooking chamber configured to obtain a photograph of the cooking chamber;
- a camera cooling fan configured to cool the camera;
- a lamp disposed toward the cooking chamber and configured to provide light into the cooking chamber; and
- an air guide configured to provide external air toward the camera, the air guide configured to guide air passed through the camera to be discharged toward a front of the camera cooling fan, wherein the air guide comprises:
- a suction duct in which the camera is provided, the suction duct being configured to form a suction flow path of air; and an exhaust duct connected to the suction duct, the camera cooling fan is provided in the exhaust duct, and the exhaust duct is configured to form an exhaust flow path of air, and wherein the exhaust duct includes a front outlet that is open toward the front of the camera cooling fan, and lamp outlets that are open toward the lamp.

14. The cooking device of claim 13, wherein the front outlet is open toward the front of the camera cooling fan.

15. The cooking device of claim 14, wherein the suction duct includes an upper housing and a lower housing provided on a lower side of the upper housing, and the upper housing is adjacent to the front outlet and is configured to guide the air discharged from the front outlet.

16. The cooking device of claim 15, wherein the upper housing includes a guide surface obliquely facing upward in a direction forward from the front outlet.

* * * * *